(12) United States Patent
Baloglu et al.

(10) Patent No.: US 11,018,102 B2
(45) Date of Patent: May 25, 2021

(54) SEMICONDUCTOR PRODUCT WITH INTERLOCKING METAL-TO-METAL BONDS AND METHOD FOR MANUFACTURING THEREOF

(71) Applicant: Amkor Technology Singapore Holding Pte. Ltd., Valley Point (SG)

(72) Inventors: Bora Baloglu, Chandler, AZ (US); Curtis Zwenger, Chandler, AZ (US); Ron Huemoeller, Gilbert, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 16/562,640

(22) Filed: Sep. 6, 2019

(65) Prior Publication Data

US 2020/0020654 A1 Jan. 16, 2020

Related U.S. Application Data

(63) Continuation of application No. 15/387,016, filed on Dec. 21, 2016, now Pat. No. 10,438,910, which is a
(Continued)

(51) Int. Cl.
*H01L 21/00* (2006.01)
*H01L 23/00* (2006.01)
(Continued)

(52) U.S. Cl.
CPC .............. *H01L 24/05* (2013.01); *H01L 24/03* (2013.01); *H01L 24/11* (2013.01); *H01L 24/13* (2013.01);
(Continued)

(58) Field of Classification Search
CPC ......... H01L 24/05; H01L 24/03; H01L 24/11; H01L 24/13; H01L 24/14; H01L 24/16; H01L 24/81; H01L 25/105; H01L 25/50; H01L 25/0657; H01L 2224/0345; H01L 2224/03452; H01L 2224/03462;
(Continued)

(56) References Cited

U.S. PATENT DOCUMENTS 5,558,271 A 9/1996 Rostoker et al.
6,355,504 B1 3/2002 Jiang
(Continued)

FOREIGN PATENT DOCUMENTS

| JP | 2002110726 | 4/2002 |
|---|---|---|
| JP | 4798222 | 10/2011 |
| KR | 10-1185454 | 10/2012 |

OTHER PUBLICATIONS

Koo et al., Journal of the Electrochemical Society, 158 (12) D698-D703 (2011), Copper Electroless Bonding of Dome-Shaped Pillars for Chip-to-Package Interconnect.
(Continued)

*Primary Examiner* — Richard A Booth
(74) *Attorney, Agent, or Firm* — McAndrews, Heid & Malloy, Ltd.

(57) ABSTRACT

A structure and method for performing metal-to-metal bonding in an electrical device. For example and without limitation, various aspects of this disclosure provide a structure and method that utilize an interlocking structure configured to enhance metal-to-metal bonding.

20 Claims, 9 Drawing Sheets

Related U.S. Application Data continuation of application No. 14/989,455, filed on Jan. 6, 2016, now Pat. No. 9,559,075.

(51) Int. Cl.
*H01L 25/00* (2006.01)
*H01L 25/10* (2006.01)
*H01L 25/065* (2006.01)

(52) U.S. Cl.
CPC .............. *H01L 24/14* (2013.01); *H01L 24/16* (2013.01); *H01L 24/81* (2013.01); *H01L 25/105* (2013.01); *H01L 25/50* (2013.01); H01L 25/0657 (2013.01); H01L 2224/0345 (2013.01); H01L 2224/0347 (2013.01); H01L 2224/03452 (2013.01); H01L 2224/03462 (2013.01); H01L 2224/03464 (2013.01); H01L 2224/03912 (2013.01); H01L 2224/03914 (2013.01); H01L 2224/0401 (2013.01); H01L 2224/0508 (2013.01); H01L 2224/0558 (2013.01); H01L 2224/05082 (2013.01); H01L 2224/05124 (2013.01); H01L 2224/05139 (2013.01); H01L 2224/05144 (2013.01); H01L 2224/05147 (2013.01); H01L 2224/05155 (2013.01); H01L 2224/05558 (2013.01); H01L 2224/05572 (2013.01); H01L 2224/05573 (2013.01); H01L 2224/05575 (2013.01); H01L 2224/05582 (2013.01); H01L 2224/05583 (2013.01); H01L 2224/05647 (2013.01); H01L 2224/05666 (2013.01); H01L 2224/05671 (2013.01); H01L 2224/1147 (2013.01); H01L 2224/13018 (2013.01); H01L 2224/13147 (2013.01); H01L 2224/13155 (2013.01); H01L 2224/1405 (2013.01); H01L 2224/16055 (2013.01); H01L 2224/16145 (2013.01); H01L 2224/16148 (2013.01); H01L 2224/16238 (2013.01); H01L 2224/32145 (2013.01); H01L 2224/32225 (2013.01); H01L 2224/73104 (2013.01); H01L 2224/73204 (2013.01); H01L 2224/80203 (2013.01); H01L 2224/81005 (2013.01); H01L 2224/8134 (2013.01); H01L 2224/81141 (2013.01); H01L 2224/81203 (2013.01); H01L 2224/81385 (2013.01); H01L 2224/81898 (2013.01); H01L 2224/92125 (2013.01); H01L 2224/94 (2013.01); H01L 2224/97 (2013.01); H01L 2225/06513 (2013.01)

(58) Field of Classification Search
CPC ... H01L 2224/03464; H01L 2224/2224; H01L 2224/0347; H01L 2224/03912; H01L 2224/03914; H01L 2224/0401
See application file for complete search history.

(56) References Cited

U.S. PATENT DOCUMENTS

| | | | |
|---|---|---|---|
| 6,469,394 B1 | 10/2002 | Wong | |
| 6,583,514 B2 | 6/2003 | Tago et al. | |
| 6,674,647 B2 | 1/2004 | Pierson et al. | |
| 8,772,150 B2 | 7/2014 | Park et al. | |
| 9,559,075 B1 * | 1/2017 | Baloglu | H01L 24/05 |
| 10,438,910 B2 * | 10/2019 | Baloglu | H01L 24/81 |
| 2008/0314627 A1 | 12/2008 | Fujino | |
| 2013/0270329 A1 | 10/2013 | Schulte | |

OTHER PUBLICATIONS

Jonathan Prange, Development and Integration of Next-Generation Copper, Nickel and Lead-Free Metallization Products, IMAPS 11th International Conference on Device Packaging, Mar. 16-15, 2015.

* cited by examiner

SEMICONDUCTOR PRODUCT WITH INTERLOCKING METAL-TO-METAL BONDS AND METHOD FOR MANUFACTURING THEREOF

CROSS-REFERENCE TO RELATED APPLICATIONS/INCORPORATION BY REFERENCE

The present application is a CONTINUATION of U.S. patent application Ser. No. 15/387,016, filed Dec. 21, 2016, and titled "SEMICONDUCTOR PRODUCT WITH INTERLOCKING METAL-TO-METAL BONDS AND METHOD FOR MANUFACTURING THEREOF"; which is a CONTINUATION of U.S. patent application Ser. No. 14/989,455, filed Jan. 6, 2016, and titled "SEMICONDUCTOR PRODUCT WITH INTERLOCKING METAL-TO-METAL BONDS AND METHOD FOR MANUFACTURING THEREOF," now U.S. Pat. No. 9,559,075. The above-identified application is hereby incorporated herein by reference in its entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present methods for forming electrical connections, for example in integrated circuits, have shortcomings. For example, though soldering is popular, solder has a relatively low melting point, which places temperature limits on subsequent processing steps as well as on the finished product. Also, solder atoms tend to migrate along copper joints, thereby changing the electrical and mechanical properties of soldered joints as they age. Direct metal-to-metal (e.g., copper-to-copper (Cu—Cu) bonds, etc.) obviates the need for solder, but cost effective processes for producing such bonds on a large scale have proven elusive since high temperatures, high pressures, and long dwell times complicate, add cost to, and add delay to the assembly process.

SUMMARY

Figure 1:
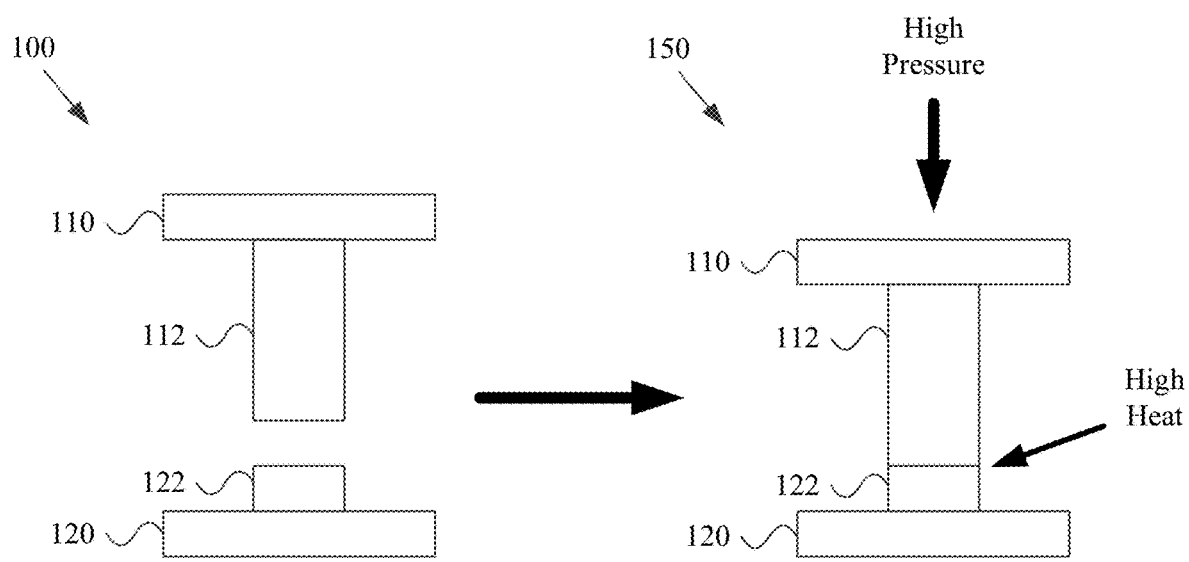
FIG. 1 shows an example metal-to-metal bond and bonding method, in accordance with various aspects of the present disclosure.

Various aspects of this disclosure provide a structure and method for performing metal-to-metal bonding in an electrical device. For example and without limitation, various aspects of this disclosure provide a structure and method that utilize an interlocking structure configured to enhance metal-to-metal bonding.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

In the drawings, various dimensions (e.g., layer thickness, width, etc.) may be exaggerated for illustrative clarity. Additionally, like reference numbers are utilized to refer to like elements through the discussions of various examples.

The discussion herein will generally provide examples in the context of copper-to-copper bonding. It should be understood, however, that the scope of this disclosure is not limited thereto, For example, the various aspects of this disclosure also apply to other metal-to-metal bonds (e.g., Au-to-Au bonds, Ag-to-Ag bonds, etc.). Also for example, various alloys may also be utilized (e.g., copper alloys, silver alloys, gold alloys, etc.). Note that metals may also comprise various levels of impurities. For example, a copper pillar may essentially be formed of 100% copper, but may also have a certain percentage of impurities.

In an example implementation provided herein, a method of manufacturing a semiconductor device comprises: providing a first substrate comprising a first copper contact structure, the first copper contact structure comprising a dome-shaped end; providing a second substrate comprising a second copper contact structure, the second copper contact structure comprising a dish-shaped end that has a dish depth; mating the dome-shaped end and the dish-shaped end, such that the dome-shaped end contacts the dish-shaped end at multiple points around a perimeter of the dome-shaped end and only at a distance into the dish-shaped cavity between 5% and 95% of the dish depth; and pressing the mated dome-shaped end and dish-shaped end together to form a copper-to-copper bond. Also provided is an electronic device produced in accordance with such example method.

In an example implementation provided herein, a method of manufacturing a semiconductor device comprises: providing a first substrate comprising a first metal contact structure of a metal, the first metal contact structure comprising a convex-shaped end that comprises: a first convex portion having a first convex radius of curvature; and a second convex portion having a second convex radius of curvature; providing a second substrate comprising a second metal contact structure of the metal, the second metal contact structure comprising a concave-shaped end that comprises a first concave portion having a first concave radius of curvature, wherein: the first concave radius of curvature is less than the first convex radius of curvature; and the first concave radius of curvature is greater than the second convex radius of curvature; mating the convex-shaped end and the concave-shaped end, such that the second convex portion contacts the concave-shaped end at multiple points around a perimeter of the concave-shaped end and the first convex portion does not contact the concave shaped end; and pressing the mated convex-shaped end and concave-shaped end together to form a metal-to-metal bond of the metal. Also provided is an electronic device produced in accordance with such example method.

In an example implementation provided herein, a method of manufacturing a semiconductor device comprises: providing a first substrate comprising a first metal contact structure of a metal, the first metal contact structure comprising a convex-shaped end; providing a second substrate comprising a second metal contact structure of the metal, the second metal contact structure comprising a concave-shaped end that comprises a center point, an edge, and a center-to-edge distance along a surface of the concave-shaped end between the center point and the edge; mating the convex-shaped end and the concave-shaped end, such that the convex-shaped end contacts the concave-shaped end at multiple points around a perimeter of the convex-shaped end and only at a distance from the center point greater than 10% and 90% of the center-to-edge distance; and pressing the mated convex-shaped end and concave-shaped end together to form a metal-to-metal bond of the metal. Also provided is an electronic device produced in accordance with such example method.

FIG. 1 shows an example metal-to-metal bonding process. As shown at label 100, two substrates 110, 120 have copper contact (or interconnection) structures 112, 122, which may also be referred to herein as contacts, which are to be joined. The substrates 110 and 120 may comprise any of a variety of characteristics. For example, one or both of the substrates 110 and 120 may comprise a semiconductor die (e.g., in wafer form, in panel form, in individual diced form, etc.). Also for example, one or both of the substrates 110 and 120 may comprise an interposer (e.g., formed on a carrier (e.g., a glass carrier, a metal carrier, a silicon carrier, etc.) which is removed after the formation, etc.). Additionally for example, one or both of the substrates 110 and 120 may comprise a laminate substrate (e.g., a packaging substrate, a motherboard, etc.). Accordingly, the scope of this disclosure should not be limited by characteristics of any particular type of substrate.

The copper contacts 112 and 122 are presented as drawn for illustrative purposes, but may for example comprise characteristics of any of a variety of different types of interconnection structures. For example, one or both of such contacts 112 and 122 may comprise a metal pillar or post (e.g., with generally vertical side surfaces). Also for example, one or both of such contacts 112 and 122 may comprise a metal pad or trace. Additionally for example, one or both of such contacts 112 and 122 may comprise a longitudinal length (or height) that is greater than a lateral width; and/or one or both of such contacts 112 and 122 may comprise a lateral width that is greater than a longitudinal length (or height). Note that in various example implementations, the first contact 112 and the second contact 122 may be formed of a same metal (e.g., copper, etc.), but this need not be the case. In another example implementation, an intervening metal may be formed between the first contact 112 and the second contact 122.

Though many of the examples presented herein show such contacts 112 and 122 in a cylindrical shape, any of a variety of shapes may be utilized. For example, one or both of the contacts 112 and 122 may have a rectangular cross-section (e.g., cross-section cut perpendicular to a vertical axis, cross-section cut perpendicular to a horizontal axis, etc.). Also for example, one or both of the contacts 112 and 122 may have a generally polygonal (e.g., N-sided, where N is an integer) cross-section (e.g., cross-section cut perpendicular to a vertical axis, cross-section cut perpendicular to a horizontal axis, etc.). Additionally for example, one or both of the contacts 112 and 122 may have a circular or elliptical cross-section (e.g., cross-section cut perpendicular to a vertical axis, cross-section cut perpendicular to a horizontal axis, etc.).

Further, many of the examples presented herein show the first contact 112 (e.g., a pillar or post, long pillar or post, etc.) being longitudinally vertically in the figures) longer than the second contact 122 (e.g., a pad or pedestal, short pillar or post, etc.). It should be understood that such relative lengths are merely illustrative and non-limiting. For example, the first contact 112 and the second contact 122 may be of equal length, the second contact 122 may be longer than the first contact 112, etc. Also, the first contact 112 and the second contact 122 are generally illustrated herein as having a same or similar axial width (e.g., horizontal dimension in the figures). It should be understood that such relative widths are merely illustrative and non-limiting. For example, the first contact 112 may be narrower than the second contact 122, the second contact 122 may be narrower than the first contact 112, etc. Also for example, the first contact 112 may have a width (e.g., a largest width at a widest portion thereof) that is less than the width (e.g., largest width at a widest portion thereof) of the second contact 122, the second contact 122 may have a width (e.g., largest width) that is less than the width (e.g., largest width) of the first contact 112, etc.

Though only one mating pair of interconnection structures is illustrated, it should be understood that many identical structures may be formed on the substrates. For example, the illustrated contacts 112 and 122 may be one of tens or hundreds of same or similar structures utilized to electrically and/or mechanically couple the substrates 110 and 120. For example, such contacts may be spaced relatively closely together (e.g., at a pitch (or center-to-center spacing) of 50 microns or less, 30 microns or less, etc.).

In various implementations, the first contact 112 and/or the second contact 122 may be formed in any of a variety of manners. For example, a metal pad or trace may be formed on a silicon substrate and exposed through a dielectric (or passivation) layer. Note that such pad or trace may be part of a multi-layer signal distribution structure. One or more seed layers and/or under bump metal (UBM) layers may be deposited (e.g., sputtered, plated, etc.) on the pad or trace, and the contact(s) may be formed on such seed and/or layer(s)), for example through openings in a dielectric template, which may then be removed. Though in various implementations, a solder cap may be formed on the contact, in accordance with various aspects of this disclosure, the formed contacts, or the tips thereof, may be left bare (e.g., without solder).

Accordingly, the scope of this disclosure should not be limited by particular characteristics of the interconnection contacts (e.g., the first contact 112 and/or the second contact 122, etc.) or by any particular manner of making such contacts.

At label 150, the substrates 110, 120 are brought together (or mated) to bring the copper contact 112 in contact with the copper contact 122. To form a Cu—Cu bond at the interface between the copper contacts 112 and 122, high pressure and high heat are generally applied for a substantial dwell time. If the two mated surfaces of the copper contacts 112 and 122 are clean (e.g., perfectly clean, etc.), then random atomic motion will eventually cause atoms to traverse the interface between the two surfaces, thus blurring the interface, and over time the interface may disappear entirely. However, this is a slow process because the atomic motion is generally random (e.g., mostly or completely random). Example pressures may for example be greater than 200 MegaPascals (MPa), example temperatures may for example be greater than 300 C, and example dwell times may for example be on the order of an hour to several hours.

Figure 2:
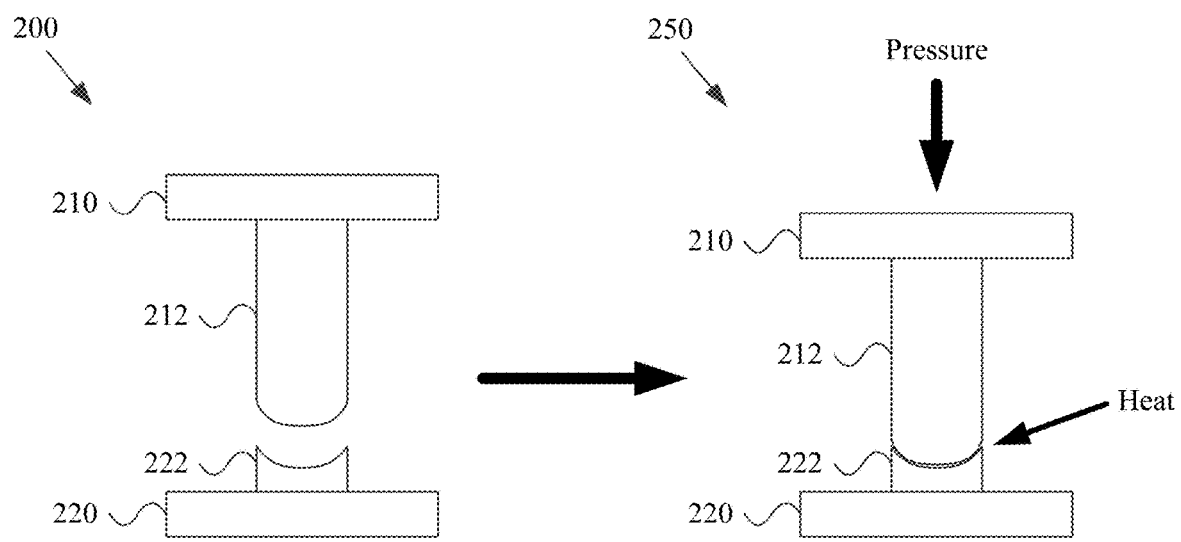
FIG. 2 shows an example interlocking metal-to-metal bond and bonding method, in accordance with various aspects of the present disclosure.

Turning now to FIG. 2, such figure shows an example interlocking metal-to-metal bond and bonding method, in accordance with various aspects of the present disclosure. The example structures and methods of FIG. 2, or any portion thereof, may share any or all characteristics with other analogous structures or methods discussed herein (e.g., with regard to FIGS. 1 and 3-9).

As shown at label 200, two substrates 210 and 220 have copper contacts 212 and 222 that are to be joined. As discussed herein (e.g., with regard to FIG. 1, etc.), the substrates 210 and 220 may comprise any of a variety of characteristics and/or may be formed in any of a variety of manners. Also as discussed herein (e.g., with regard to FIG. 1, etc.), the copper contacts 212 and 222 may comprise any of a variety of characteristics and/or may be formed in any of a variety of manners.

As will be discussed in detail herein, the first copper contact 212 comprises a convex-shaped (e.g., dome-shaped, etc.) end, and the second copper contact 222 comprises a concave-shaped (e.g., dish-shaped, etc.) end.

The first copper contact 212 may, for example, be formed utilizing a metal plating operation. The shape of the end of the first copper contact 212 (e.g., the end that is to contact a corresponding end of the second copper contact 222) may be formed to have a convex shape. Such a shape may, for example, be obtained by adjusting various plating process parameters. For example, in an example implementation, a convex-shaped end may be obtained by increasing the concentration of a leveler utilized in the plating process. For example, a convex end (or dome) height of greater than 10% or 15% of the overall height of the contact may be obtained by doubling the concentration of leveler utilized to obtain a generally flat end.

The second copper contact 222 may, for example, be formed utilizing a metal plating operation. The shape of the end of the second copper contact 222 (e.g., the end that is to contact a corresponding end of the first copper contact 212) may be formed to have a concave shape. Such a shape may, for example, be obtained by adjusting plating process parameters. For example, in an example implementation, a concave-shaped end may be obtained by decreasing the concentration of a leveler utilized in the plating process. For example, a concave end (or dish) depth of greater than 10% or 15% of the overall height of the contact may be obtained by halving the concentration of leveler utilized to obtain a generally flat end.

In an example implementation, the degree of convexity and/or concavity at various points on the ends of the contacts may be tuned by adjusting the concentration of the leveler in a single plating process and/or by adjusting the concentration of the leveler in a plurality of sequential plating processes. Note that in an example implementation that includes a plurality of sequential plating processes, each plating process need not cover the exact same area, thus providing a large degree of flexibility in shaping the ends of the contacts.

At label 250, as at label 150 of FIG. 1, the substrates 210, 220 are brought together (or mated) to bring the copper contact 212 in contact with the copper contact 222. To form a Cu—Cu bond at the interface between the copper contacts 212 and 222, pressure and heat may be applied for a dwell time. If the two mated surfaces of the copper contacts 212 and 222 are clean (e.g., perfectly clean, etc.), then random atomic motion will eventually cause atoms to traverse the interface between the two surfaces, thus blurring the interface, and over time the interface may disappear entirely. However, if the mating surfaces of the copper contacts 212 and 222 are exactly matched, this may still be a slow process, generally as with the example method of FIG. 1, because the atomic motion is generally random (e.g., mostly or completely random). Thus, in accordance with various aspects of this disclosure, as discussed herein, the mating surfaces may be intentionally mismatched to enhance the metal-to-metal bonding.

In accordance with various aspects of this disclosure, an underfill may be formed between the substrates 210 and 220. For example, after the attachment between the copper contacts 212 and 222, an underfill may be formed between the substrates 210 and 220 and/or surrounding the copper contacts 212 and 222 (e.g., by capillary underfilling, molded underfilling, etc.). In another example, before the attachment between the copper contacts 212 and 222, pre-applied underfill (e.g., with a non-conductive paste (NCP), etc.) may be formed on one or more of the substrates 210 and 220. Such underfill formation may, for example, be performed without contaminating the mating ends of the copper contacts 212 and 222 prior to their mating.

Figure 3:
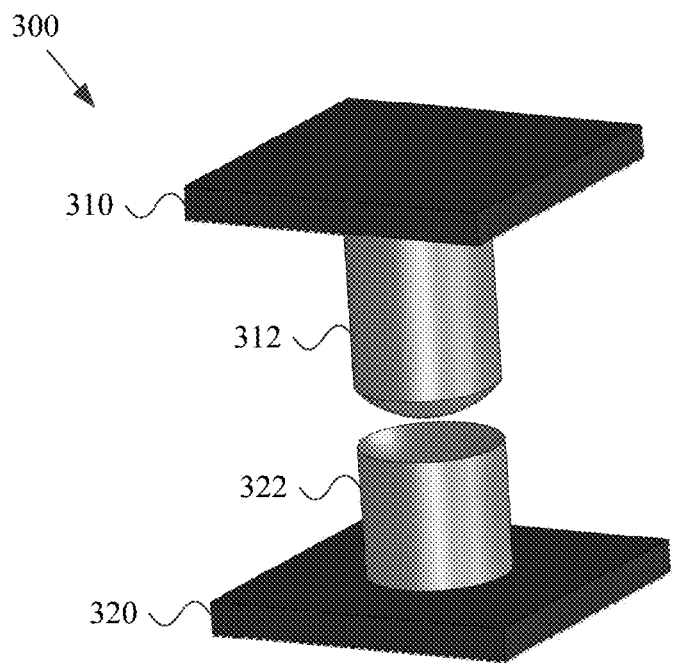
FIG. 3 shows a perspective view of an example interlocking structure and bonding method, in accordance with various aspects of the present disclosure.

Turning to FIG. 3, such Figure shows a perspective view 300 of an example interlocking structure and bonding method, in accordance with various aspects of the present disclosure. The example structures and methods of FIG. 3, or any portion thereof, may share any or all characteristics with other analogous structures or methods discussed herein (e.g., with regard to FIGS. 2 and 4-9).

Figure 4:
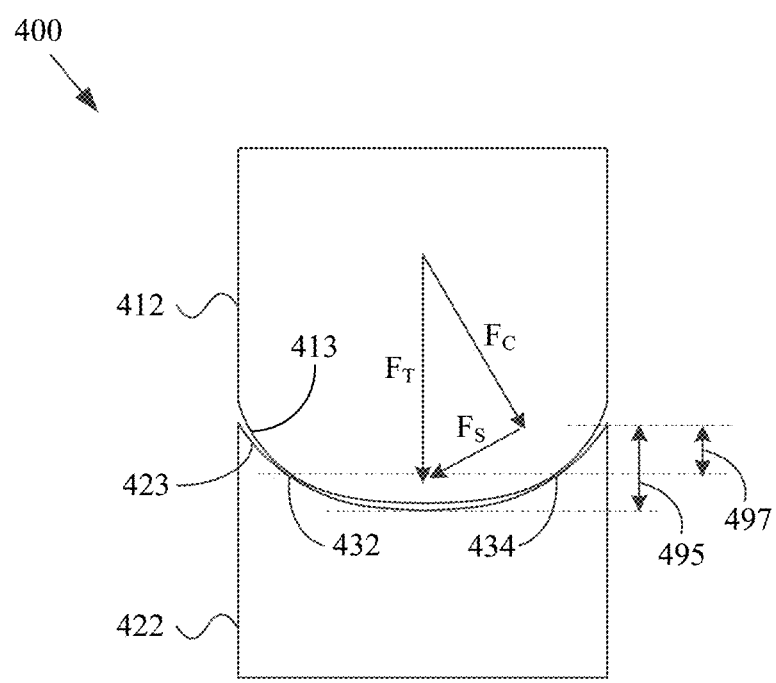
FIG. 4 shows a cross-sectional view of an example interlocking structure and bonding method, in accordance with various aspects of the present disclosure.

As discussed herein, the ends of the interconnection structures may be formed to imperfectly mate. FIG. 4 shows a cross-sectional view of an example interlocking structure and method, in accordance with various aspects of the present disclosure. The example structures and methods of FIG. 4, or any portion thereof, may share any or all characteristics with other analogous structures or methods discussed herein (e.g., with regard to FIGS. 1-3 and 5-9).

The first (or top) copper contact 412 comprises a convex surface 413, and the second (or bottom) copper contact 422 comprises a concave surface 423 that faces the convex surface 413. The illustration 400 is a cross-sectional view taken along a longitudinal axis running through both of the first copper contact 412 and the second copper contact 422 when such contacts are aligned along the longitudinal axis. In the cross-sectional illustration 400, the convex surface 413 is shown contacting the concave surface 423 at a first contact point 432 and at a second contact point 434. In three dimensions, as will be discussed herein, such contact may extend around the convex surface 413 (e.g., forming a circle, etc.).

The concave surface 423 comprises a depth 495 (e.g., a largest depth) between the top peripheral edge of the concave surface 423 and a bottom point (e.g., a center point on the concave surface 423, etc.) of the concavity. The first contact point 432 and the second contact point 434 are shown approximately vertically half way 497 between the top peripheral edge and the bottom point. In various example implementations, the contact points 432 and 434 may be located vertically from 25% to 75% of the depth 495 into the concave region (e.g., the dish-shaped region, etc.) from the vertical level of the top peripheral edge. In various other example implementations, the contact points 432 and 434 may be located vertically from 10% to 90% of the depth 495 into the concave cavity from the vertical level of the top peripheral edge, or from 5% to 95% of the depth 495 into the concave region from the vertical level of the top peripheral edge; or from 0% to 95% of the depth 495 into the concave region from the vertical level of the top peripheral edge.

The first contact point 432 and the second contact point 434 may also, for example, be located between 25% and 75% of the distance along the concave surface 423 from the bottom (or center) point to the top peripheral edge. In another example implementation, the first contact point 432 and the second contact point 434 may, for example, be located between 10% and 90% of the distance along the concave surface 423 from the bottom point to the top peripheral edge, or from 5% and 95% of the distance along the concave surface 423 from the bottom point to the top peripheral edge, or greater than 5% or 10% of the distance along the concave surface 423 from the bottom point to the top peripheral edge (which may, for example, extend all of the way to the top peripheral edge).

As shown in FIG. 4, a total force $F_T$ may be applied to press the first copper contact 412 and the second copper contact 422 together. Since at the points of contact 432 and 434, the convex surface 413 and the concave surface 423 contact each other at an angle that is not orthogonal to the direction of the force $F_T$, there is a compression force $F_C$ component of the force $F_T$, which operates to press the convex surface 413 and the concave surface 423 directly together (e.g., acting orthogonally to the interface at the points of contact 432 and 434). Such a force $F_C$ may also be referred to herein as a normal force, There is also a shear force $F_S$ component of the force $F_T$, which operates tangentially along the interface between the convex surface 413 and the concave surface 423 at the points of contact 432 and 434.

The combination of the compression force $F_C$ and the shear force $F_S$ operates on the metal (e.g., the copper, etc.) of the first copper contact 412 and the second copper contact 422 to cause plastic deformation. Such plastic deformation may, in turn, increase the degree of atomic diffusion between the convex surface 413 and the concave surface 423. Such increased degree of diffusion, in turn, may result in an overall decrease in the amount of pressure, temperature, and/or dwell time needed to create an effective copper-to-copper bond between the first copper contact 412 and the second copper contact 422.

Depending on the amount of deformation of the convex surface 413 and the concave surface 423, after the metal-to-metal (e.g., copper-to-copper, etc.) bonding has completed, there may be gaps between respective portions of the convex surface 413 and the concave surface 423. Note that this need not necessarily be the case. For example, during the bonding process, enough deformation of the convex surface 413 and/or the concave surface 423 may occur to eliminate some or all of the gaps between the convex surface 413 and the concave surface 423.

Figure 5:
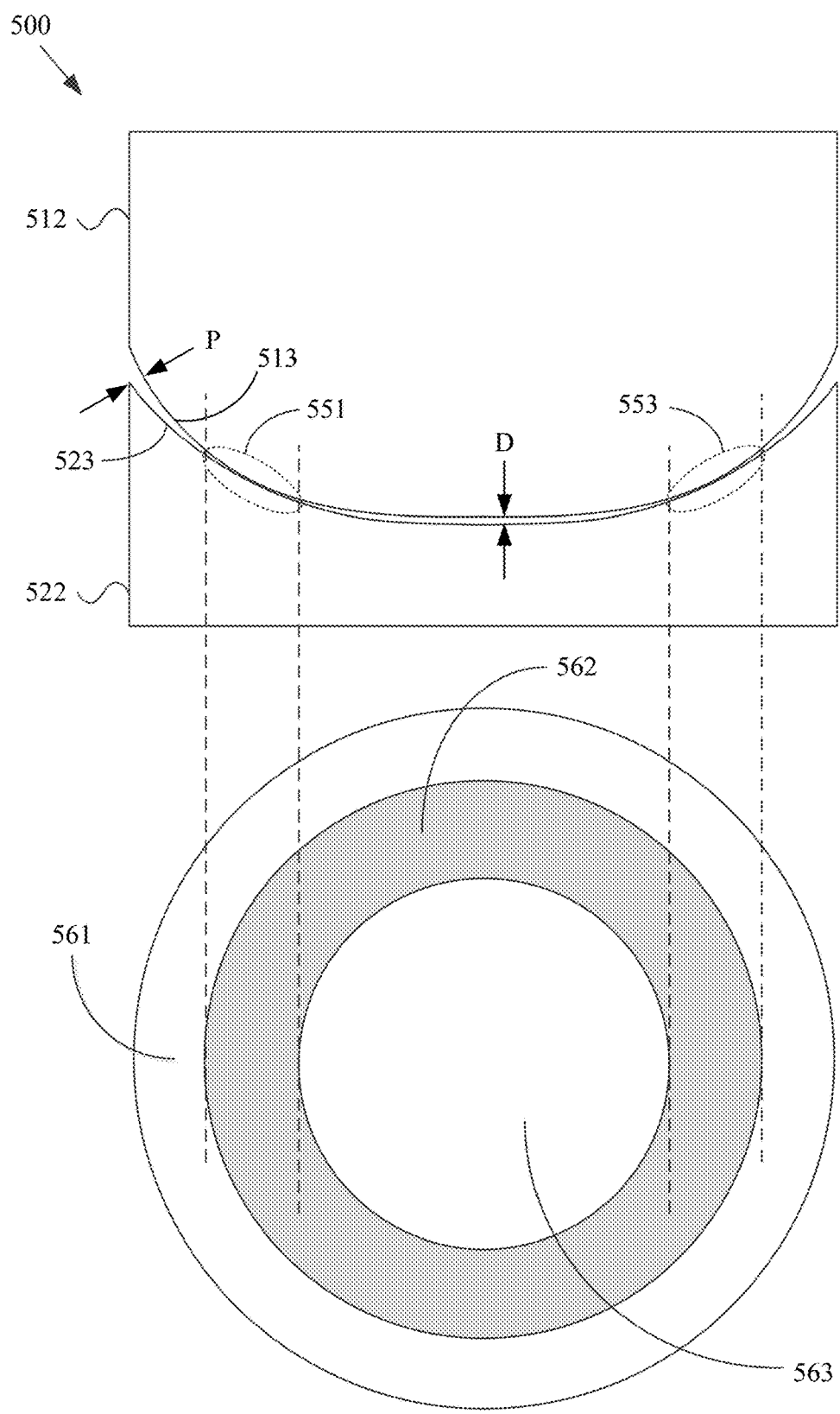
FIG. 5 shows cross-sectional views of an example interlocking structure and bonding method, in accordance with various aspects of the present disclosure.

FIG. 5 shows cross-sectional views of an example interlocking structure, in accordance with various aspects of the present disclosure. The example structures and methods of FIG. 5, or any portion thereof, may share any or all characteristics with other analogous structures or methods discussed herein (e.g., with regard to FIGS. 1-4 and 6-9). The top half of FIG. 5 is for example a cross-sectional view cut along the longitudinal axis e.g., up/down in the example illustrations herein), and the bottom half of FIG. 5 is for example a top-down view of a region proximate the metal-to-metal bonds.

As mentioned herein, even after the metal-to-metal bonding process, there may be gaps between various respective portions of the convex surface 513 and the concave surface 523. The example illustration 500 provides illustrative examples of such gaps. The size of such gaps may, for example, be exaggerated for illustrative clarity.

The example 500 comprises a middle region 562 corresponding to plastic deformation of the convex surface 513 and/or the concave surface 523 and metal-to-metal bonding between the first copper contact 512 and the second copper contact 522. The middle region 562, for example, comprises the region 551 and region 553, as shown in the upper cross-sectional view. In an example implementation, the middle region 562 forms a ring around a middle of the convex surface 513 and within the concave surface 523. Also for example, there is a gap in the center region 563 of height (e.g., largest height) D between the convex surface 513 (e.g., a tip or center thereof) and the bottom (or center) of the concave surface 523. Additionally for example, there is a gap in the peripheral region 561 of height (e.g., largest height) P between the convex surface 513 (e.g., a peripheral edge thereof) and the peripheral edge of the concave surface 523.

Though as explained herein, the deformation of the convex surface 513 and/or concave surface 523 may be enough to eliminate gaps between such surfaces, this need not be the case. For example, the convex surface 513 and the concave surface 523 may contact each other and be metal-to-metal bonded to each other in the center region 563 and/or in the peripheral region 561. Such bonds, if they exist, may for example be weaker (or less complete) than the bond in the bonding region 562 but need not be. For example, in an example implementation, interface lines in the center region 563 and/or in the peripheral region 561 between the convex surface 513 and the concave surface 523 may be more apparent (e.g., more visible, etc.) after the bonding process than interface lines in the middle region 562.

Though the example 500 of FIG. 5 is generally illustrated with symmetrical characteristics, such symmetry is not required. For example, the first contact 512 and/or the second contact 522 may be asymmetric. Such asymmetry, in turn, may lead to asymmetry in the region in which the first contact 512 and the second contact 522 are bonded. For example, referring to the bonding region 562 of FIG. 5, such bonding region 562 may be off-center (or shifted) with regard to the centers of the first contact 512 and/or the second contact 522 (e.g., at least 5% or 10% of the contact width, at least a percentage greater than the manufacturing tolerance, etc.). Also for example, one side of the bonding region 562 may be thinner than another side (e.g., the region 551 may be shorter than the region 553 or vice versa), for example at least 5% or 10% of either region width, at least a percentage greater than the manufacturing tolerance, etc. Additionally for example, one side of the bonding region 562 may be positioned differently relative to the center than another side (e.g., the region 551 may be shifted relative to the center while the region 553 is not or is shifted by a different amount). Further for example, gap P shown at the left side of FIG. 5 may be different from an analogous gap at the right side of FIG. 5 (e.g., at least 5% or 10% of the gap P width, to a percentage greater than the manufacturing tolerance, etc.).

The shapes of various example convex and concave surfaces may also be described in terms of one or more radii of curvature. A non-limiting example of such characterization is provided at FIG. 6, which shows a cross-sectional view of an example interlocking structure and bonding method, in accordance with various aspects of the present disclosure. The example structures and methods of FIG. 6, or any portion thereof, may share any or all characteristics with other analogous structures or methods discussed herein (e.g., with regard to FIGS. 1-5 and 7-9).

In the example illustration 600, the first metal contact 612 comprises a convex surface 613. A portion of the convex surface 613 in a central region 655 may, for example, have a radius of curvature of R2. Also for example, a portion of the convex surface 613 in middle regions 651 and 653 may have a radius of curvature of R3. Additionally for example, a portion of the convex surface 613 in peripheral regions 657 and 659 may have a radius of curvature of R4.

Also in the example illustration 600, the second metal contact 622 comprises a concave surface 623 that has a radius of curvature of R1. It should be noted that the concave surface 623 is presented as having a single radius of curvature, but such characterization is utilized for illustrative clarity. For example, a plurality of portions of the concave surface 623 may each comprise a different respective radius of curvature. In the example illustration 600, R2>R1 and R3<R1. Additionally, R3<R4<R1. In another example implementation R4=R3.

Note that during the bonding process, due to deformation of the convex surface 613 and/or the concave surface 623, the radius of curvature will generally become the same in the regions in which the metal-to-metal bonding occurs. In a first example implementation, in which metal-to-metal bonding only occurs in the middle region 662 (e.g., including the cross-section regions 651 and 653), a gap remains between the convex surface 613 and the concave surface 623 in the center region 663 and in the peripheral region 661. In such an example implementation, due to deformation, the radius of curvature of the convex surface 613 and the concave surface 623 will become generally the same in the middle region 662, R2 will remain greater than R1, and R4 will remain less than R1.

In an example implementation in which metal-to-metal bonding ultimately occurs in the center region 663 as well as the middle region 662, for example due to deformation, the radius of curvature of the convex surface 613 and the concave surface 623 will become generally the same in the center region 663 as well as the middle region 662. In an example implementation in which metal-to-metal bonding ultimately occurs in the peripheral region 661 as well as the middle region 662 (e.g., in addition to or instead of in the center region 663), for example due to deformation, the radius of curvature of the convex surface 613 and the concave surface 623 will become generally the same in the peripheral region 661 as well as the middle region 662.

Figure 6:
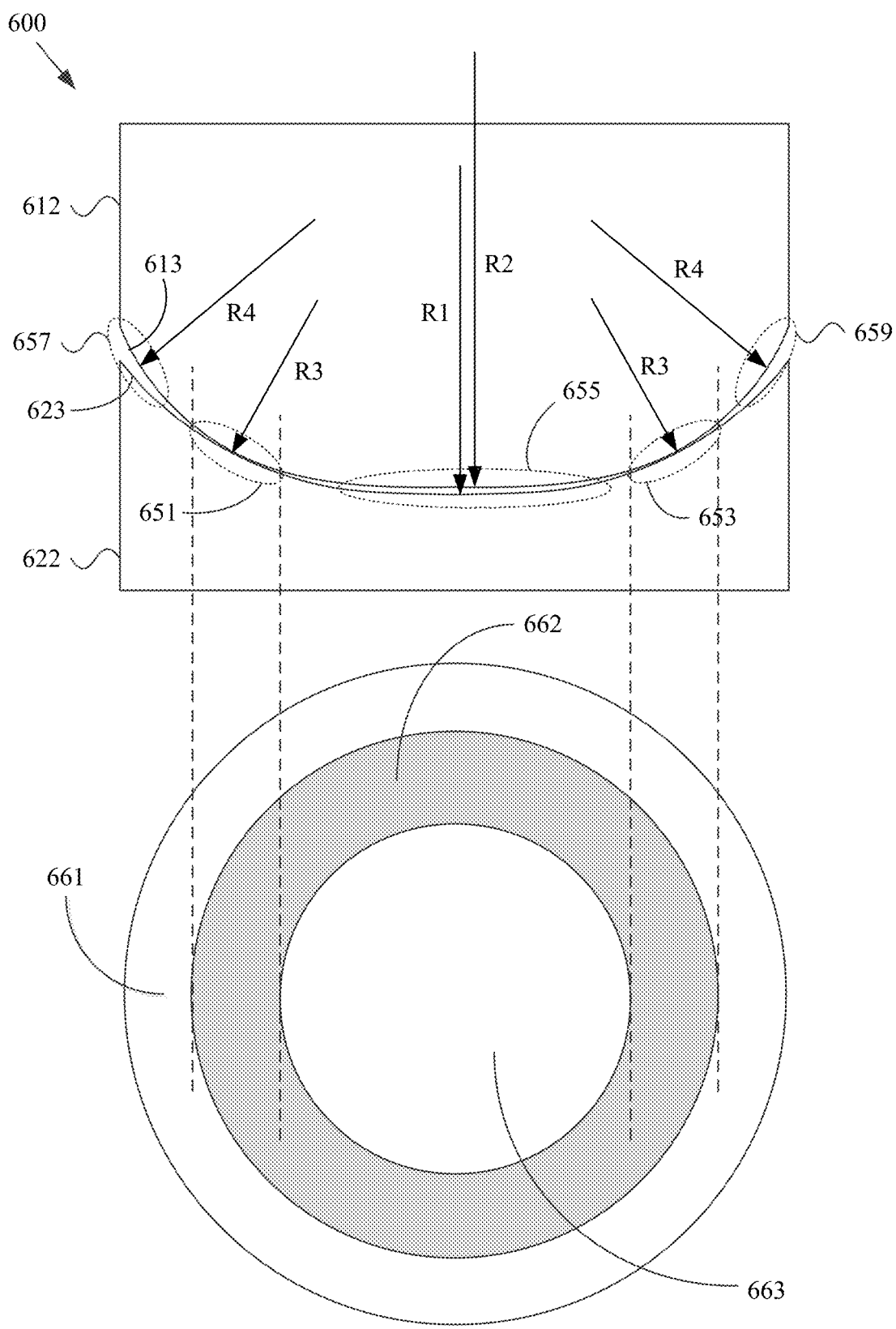
FIG. 6 shows a cross-sectional view of an example interlocking structure and bonding method, in accordance with various aspects of the present disclosure.

As discussed herein (e.g., with regard to FIG. 5), though the example 600 of FIG. 6 is generally illustrated with a symmetrical characteristics, such symmetry is not required. For example, the first contact 612 and/or the second contact 622 may be asymmetric. Such asymmetry, in turn, may lead to asymmetry in the region in which the first contact 612 and the second contact 622 are bonded. For example, referring to the bonding region 662 of FIG. 6, such bonding region 662 may be off-center (or shifted) with regard to the centers of the first contact 612 and/or the second contact 622 (e.g., at least 5% or 10% of the contact width, at least a percentage greater than the manufacturing tolerance, etc.). Also for example, one side of the bonding region 662 may be thinner than another side (e.g., the region 651 may be shorter than the region 653 or vice versa), for example at least 5% or 10% of either region width, at least a percentage greater than the manufacturing tolerance, etc. Additionally for example, one side of the bonding region 662 may be positioned differently relative to the center than another side (e.g., the region 651 may be shifted relative to the center while the region 653 is not or is shifted by a different amount). Further for example, the R3 (and/or R4) shown at the left side of FIG. 6 may be different from the R3 (and/or R4) shown at the right side of FIG. 6 (e.g., at least 5% or 10% of R3 (and/or R4), to a percentage greater than the manufacturing tolerance, etc.).

Figure 7:
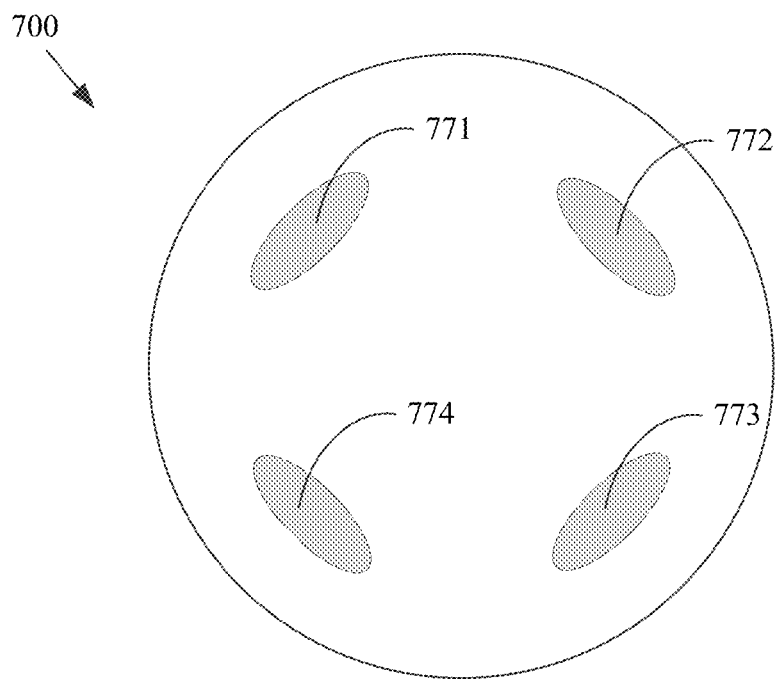
FIG. 7 shows cross-sectional views of example interlocking structures and bonding method, in accordance with various aspects of the present disclosure.
Figure 7:
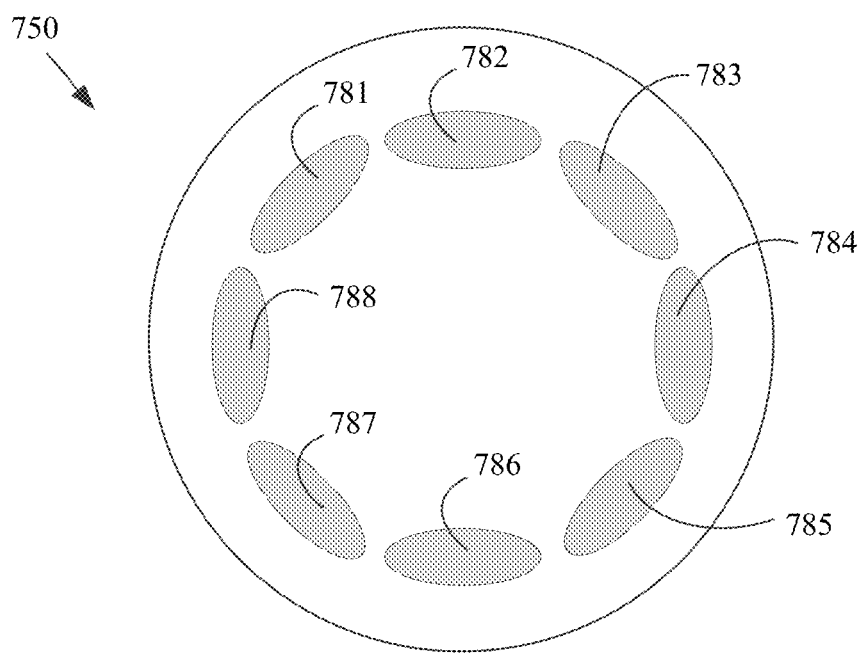

As discussed herein, the metal contacts may be cylindrical, rectangular, generally polygonal, etc. In various example implementations, there need not be a continuous bonding line or region between the convex surface and the concave surface, but in other example implementations there may be a continuous bonding line or region. FIG. 7 shows cross-sectional views of example interlocking structures, in accordance with various aspects of the present disclosure. In such examples, the metal-to-metal bonding regions are distinct, rather than continuous.

For example, in the example illustration at label 700 of FIG. 7, a contact with a square cross-section may deform and bond at four corner regions 771, 772, 773, and 774. Also example, in the example illustration at label 750 of FIG. 7, a contact with an octagonal cross-section may deform and bond at eight corner regions 781-788. Note that, as discussed herein, due to deformation of the contacts during the bonding process, even in scenarios in which the initial contact between the first and second metal contacts occurs only at distinct points, as the convex and/or concave surfaces deform, such contact may spread to create continuously coupled regions of bonding, and even spread to create a comprehensive region of bonding over the entire convex and/or concave surface.

As mentioned herein, though only one mating pair of interconnection structures is generally illustrated and discussed in the examples, it should be understood that many identical structures may be formed on the substrates. For example, the illustrated contacts may be one of tens or hundreds of same or similar structures utilized to electrically and/or mechanically couple the substrates. For example, such contacts may be arranged in an array, a solid matrix, a square or rectangular arrangement, in a line, in parallel lines, etc. It should be understood that although all of the contacts may be similar to the contacts discussed herein, all of the contacts need not be the same. For example, in an example implementation of an electronic component with a plurality of the contacts, a first portion of the contacts may be different from a second portion of the contacts. Also for example, a first portion of the contacts may be as discussed herein, and a second portion may have substantially flat ends. Additionally for example, a first portion of the contacts may be asymmetric, and a second portion may be symmetric. Further for example, a first portion of the contacts may have a first height, width, or pitch, and a second portion of the contacts may have a second height, width, or pitch, different from the first height, width, or pitch.

As mentioned herein, the substrate may be in various forms, including wafer form. Thus, the scope of this disclosure includes wafer level bumping (e.g., copper pillar wafer level bumping). Examples of a bumping process (e.g., a wafer level bumping process, etc.) are provided in FIGS. 8 and 9.

FIGS. 8A-8E show cross-sectional views of various stages of a method of forming an interconnection structure, in accordance with various aspects of the present disclosure. The example structures and/or methods shown in FIGS. 8A-8E, or any portion thereof, may share any or all characteristics with other analogous structures and/or methods shown herein (e.g., with regard to FIGS. 1-7 and 9). Though the formation of only one wafer level bump is illustrated, it should be understood that such formation may be replicated hundreds or thousands of times on a single wafer. Also note that the scope of this disclosure is not limited to wafer level operations. For example, any or all of the operations discloses here may be performed on individual die, panels of die, wafers of die.

Figure 8A:
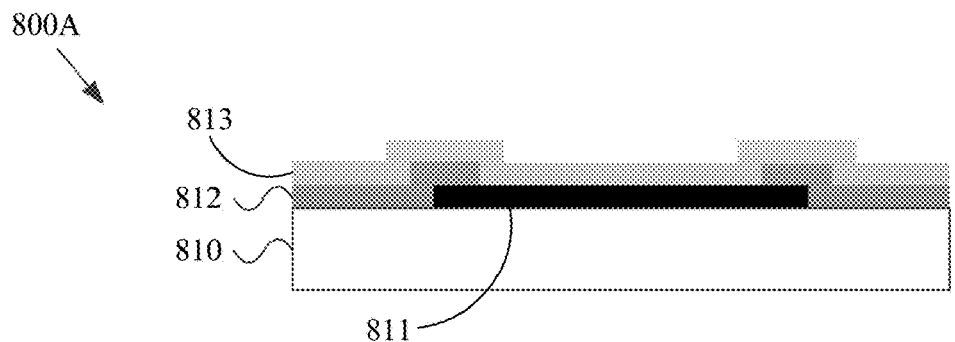
FIGS. 8A-8E show cross-sectional views of various stages of a method of forming an interconnection structure, in accordance with various aspects of the present disclosure.

At FIG. 8A, a substrate 810 comprising a pad 811 (e.g., an I/O pad, a bond pad, etc.) is presented (e.g., received, fabricated, etc.). Note that any number of pads may be present, but only one is shown here for illustrative clarity. The substrate 810 may, for example, comprise a semiconductor die (e.g., a silicon semiconductor die, an active side of a semiconductor die, a back-side of a semiconductor die with an electrical connection to the front-side, etc.).

A bond pad 811 may, for example, be formed to cover a top portion of the substrate 810 at contact locations. The pad 811 may, for example, comprise any of a variety of conductive materials (e.g., copper, aluminum, silver, gold, nickel, alloys thereof, etc.).

A dielectric layer 812 (which may also be referred to as a passivation layer) is formed on the substrate 810, for example to cover a top side of the substrate 810. The dielectric layer 812 may, for example, cover side surfaces of the bond pad 811 and/or an outer perimeter of the top surface of the bond pad 811. The dielectric layer 812 may comprise any of a variety of types of materials, for example inorganic materials (e.g., a nitride ($Si_3N_4$), an oxide ($SiO_2$), SiON, etc.) and/or organic materials (e.g., polyimide (PI), benzo cyclo butane (BCB), poly benz oxazole (PBO), bismaleimide triazine (BT), a phenolic resin, epoxy, etc.), but the scope of the present disclosure is not limited thereto. The dielectric layer 812 may, for example, be formed by any of a variety of processes (e.g., spin coating, printing, spray coating, sintering, thermal oxidation, Physical Vapor Deposition (PVD), Chemical Vapor Deposition (CVD), atomic layer deposition (ALD), etc.). The dielectric layer 812 may, for example, comprise an aperture through which at least a portion of the pad 811 is exposed.

A UBM seed layer 813 may be formed over the dielectric layer 812 and/or over the portion of the pad 811 that is exposed through the aperture in the dielectric layer 812. The UBM seed layer 813 may, for example, comprise any of a variety of conductive materials (e.g., copper, gold, silver, metal, etc.). The UBM seed layer 813 may be formed in any of a variety of manners (e.g., sputtering, electroless plating, CVD, PVD, ALD, etc.).

Figure 8B:
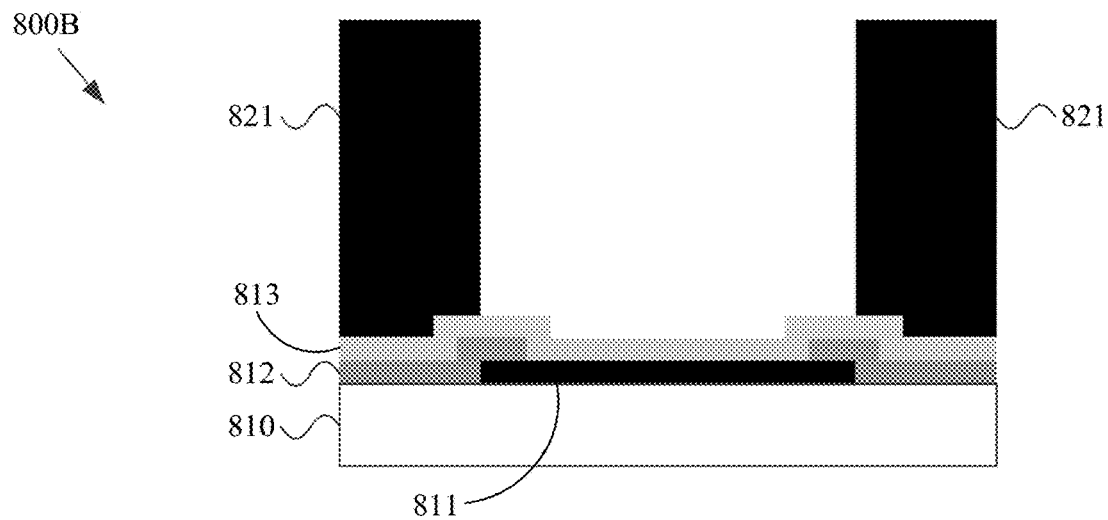

As shown in FIG. 8B, a mask 821 (or template) is formed and/or patterned over the UBM seed layer 813 to define a region in which a UBM and/or interconnection structure (e.g., metal pillar, etc.) is to be formed. For example, the mask 821 may comprise a photoresist (PR) material or other material, which may be patterned to cover regions other than the region on which a UBM and/or interconnection structure is to be formed.

Figure 8C:
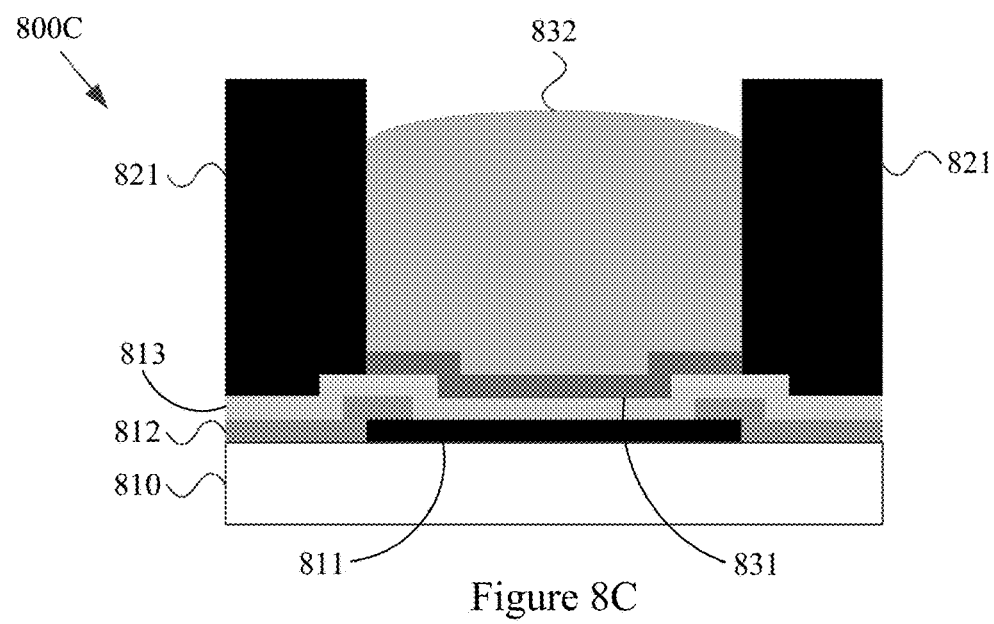

As shown in FIG. 8C, the UBM 831 is formed on the UBM seed layer 813 exposed through the mask 821. The UBM 831 may comprise any of a variety of materials (e.g., titanium, chromium, aluminum, titanium/tungsten, titanium/nickel, copper, alloys thereof, etc.). The UBM 831 may be formed on the UBM seed layer 813 in any of a variety of manners (e.g., electroplating, electroless plating, sputtering, CVD, PVD atomic layer deposition (ALD), etc.).

As also shown in FIG. 8C, the interconnection structure 832 is formed on the UBM 831. The interconnection structure 832 may comprise any of a variety of characteristics. For example, the interconnection structure 832 may share any or all characteristics with any or all of the interconnections structures (e.g., the contacts 212, 222, 312, 322, 412, 422, 512, 522, 612, 622, etc.) discussed herein. The interconnection structure 832 may, for example, comprise copper (e.g., pure copper, copper with some impurities, etc.), a copper alloy, nickel, etc.).

As discussed herein, the interconnection structure 832 may be formed to have a convex-shaped (or dome-shaped) end, for example by adjusting leveler concentration. For example, a convex end (or dome) height of greater than 10% or 15% of the overall height of the interconnection structure 832 may be obtained by doubling the concentration of leveler utilized to obtain a generally flat end.

Figure 8D:
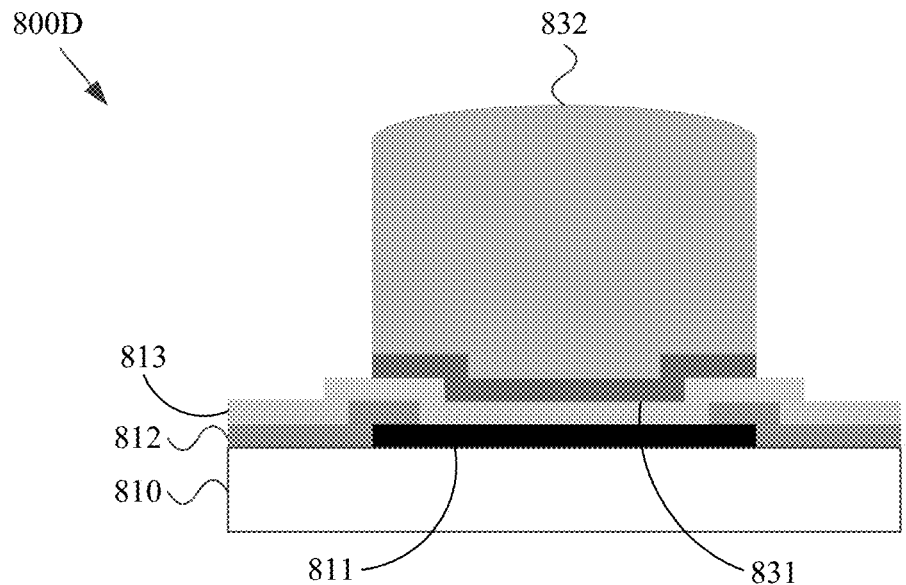
Figure 8E:
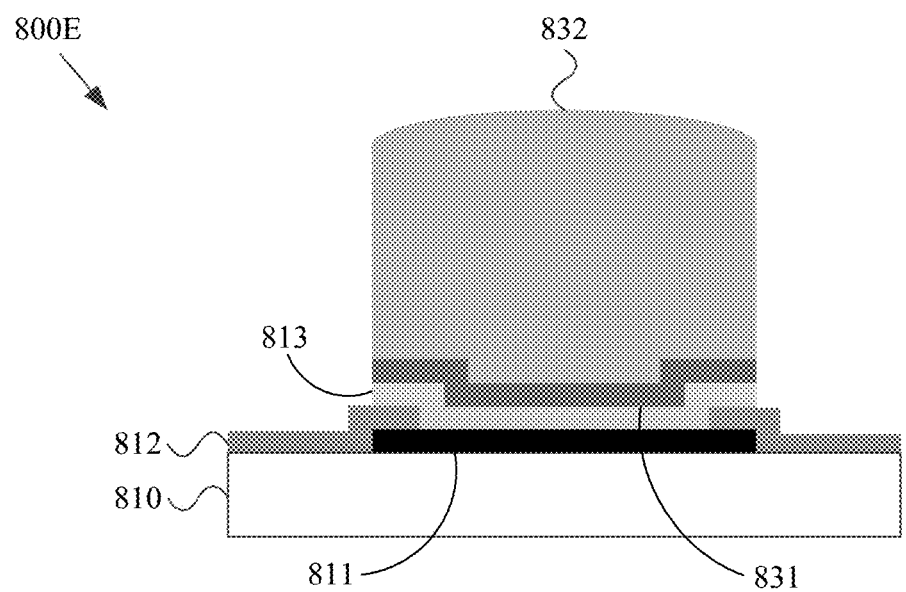

As shown at FIG. 8D (e.g., as compared to FIG. 8C), the mask 821 (e.g., photoresist, etc.) is stripped. The mask 821 may be removed in any of a variety of manners (e.g., chemical stripping, aching, etc.). As shown at FIG. 8E (e.g., as compared to FIG. 8D), the UBM seed layer 813 (e.g., at least the portion that is not covered by the interconnection structure 832) is removed (e.g., chemically etched, etc.). Note that during the etching of the seed layer 813, a lateral edge portion of at least the UBM seed layer 813 may, for example, be etched. Such etching may, for example, result in an undercut beneath the interconnection structure 832 and/or UBM 831.

As discussed herein, an interconnection structure may be formed with a concave-shaped (or dish-shaped) end instead of with a convex-shaped (or dome-shaped) end. An example of such formation is shown in FIGS. 9A-9C.

Figure 9A:
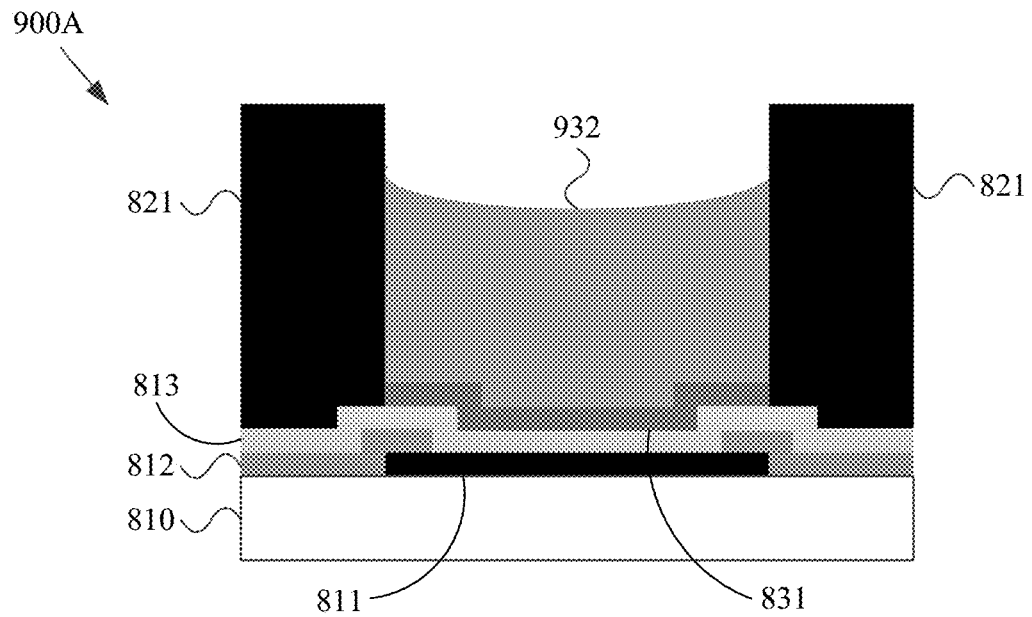
FIGS. 9A-9C show cross-sectional views of various stages of a method of forming an interconnection structure, in accordance with various aspects of the present disclosure.
Figure 9B:
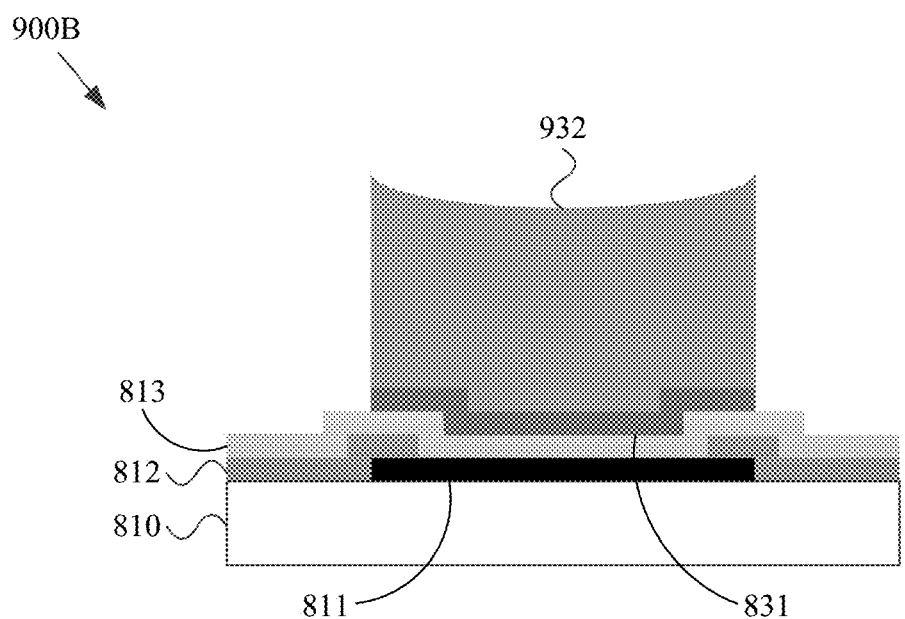
Figure 9C:
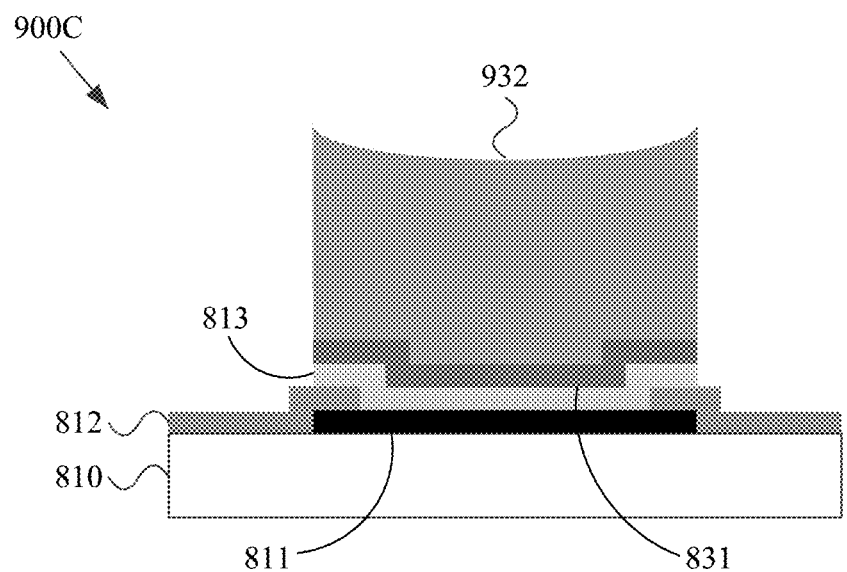

FIGS. 9A-9C show cross-sectional views of various stages of a method of forming an interconnection structure, in accordance with various aspects of the present disclosure. The method shown in FIG. 9 may, for example, share any or all characteristics with the method shown in FIG. 8. Thus, this discussion will focus generally on the differences. The example structures and/or methods shown in FIGS. 9A-9C, or any portion thereof, may share any or all characteristics with other analogous structures and/or methods shown herein (e.g., with regard to FIGS. 1-8). Though the formation of only one wafer level bump is illustrated, it should be understood that such formation may be replicated hundreds or thousands of times on a single wafer. Also note that the scope of this disclosure is not limited to wafer level operations. For example, any or all of the operations discloses here may be performed on individual die, panels of die, wafers of die, etc.

As shown in FIG. 9A, as with FIG. 8C, the UBM 831 is formed on the UBM seed layer 813 exposed through the mask 821. The UBM 831 may comprise any of a variety of materials (e.g., titanium, chromium, aluminum, titanium/tungsten, titanium/nickel, copper, alloys thereof, etc.), The UBM 831 may be formed on the UBM seed layer 813 in any of a variety of manners (e.g., electroplating, electroless plating, sputtering, CVD, PVD, atomic layer deposition (ALD), etc.).

As also shown in FIG. 9A, as with the interconnection structure 832 of FIG. 8C, the interconnection structure 832 is formed on the UBM 831. The interconnection structure 832 may comprise any of a variety of characteristics. For example, the interconnection structure 832 may share any or all characteristics with any or all of the interconnections structures (e.g., the contacts 212, 222, 312, 322, 412, 422, 512, 522, 612, 622, etc.) discussed herein. The interconnection structure 832 may, for example, comprise copper (e.g., pure copper, copper with some impurities, etc.), a copper alloy, nickel, etc.).

As discussed herein, the interconnection structure 932 (as opposed to the example interconnection structure 832 of FIG. 8) may be formed to have a concave-shaped (or dish-shaped) end, for example by adjusting leveler concentration. For example, in an example implementation, a concave-shaped end may be obtained by decreasing the concentration of a leveler utilized in the plating process. For example, a concave end (or dish)) depth of greater than 10% or 15% of the overall height of the interconnection structure 932 may be obtained by halving the concentration of leveler utilized to obtain a generally flat end.

As shown at FIG. 9B (e.g., as compared to FIG. 9A), the mask 821 (e.g., photoresist, etc.) is stripped. The mask 821 may be removed in any of a variety of manners (e.g., chemical stripping, ashing, etc.). As shown at FIG. 9C (e.g., as compared to FIG. 9B), the UBM seed layer 813 (e.g., at least the portion that is not covered by the interconnection structure 832) is removed (e.g., chemically etched, etc.). Note that during the etching of the seed layer 813, a lateral edge portion of at least the seed layer 813 may, for example, be etched. Such etching may, for example, result in an undercut beneath the interconnection structure 832 and/or UBM 831.

In summary, various aspects of the present disclosure provide a structure and method for performing metal-to-metal bonding in an electrical device. For example and without limitation, various aspects of this disclosure provide a structure and method that utilize an interlocking structure configured to enhance metal-to-metal bonding. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   an upper substrate;
   a metal pillar that comprises a metal, the metal pillar comprising an upper pillar end coupled to the upper substrate, a lower pillar end, and a pillar sidewall between the upper pillar end and the lower pillar end;
   a lower substrate that is lower in a vertical direction than the upper substrate;
   a metal contact structure comprising the metal, the metal contact structure comprising a lower side coupled to the lower substrate, and an upper side that comprises a cavity; and
   a metal-to-metal bond between the lower pillar end and the upper side of the metal contact structure,
   wherein the metal-to-metal bond is positioned within a first range of vertical heights within the cavity, but not within a second range of vertical heights within the cavity, where the first range of vertical heights is lower in the vertical direction than the second range of vertical heights.

2. The electronic device of claim 1, wherein the second range of vertical heights within the cavity comprises a lateral gap between said metal of the metal pillar and said metal of the metal contact structure that encircles said metal of the metal pillar.

3. The electronic device of claim 2, wherein the lateral gap is free of conductive material.

4. The electronic device of claim 2, wherein the lateral gap is wider at an upper end of the second range of vertical heights than at a lower end of the second range of vertical heights.

5. The electronic device of claim 1, wherein a third range of vertical heights within the cavity is free of the metal-to-metal bond, the first range being vertically between the second range and the third range.

6. The electronic device of claim 1, wherein in a horizontal cross-section perpendicular to the vertical direction, the metal pillar is polygonal.

7. The electronic device of claim 1, wherein in the first range, the pillar sidewall is vertical and lateral sides of the cavity are not vertical.

8. The electronic device of claim 1, wherein in a vertical cross-section, at least a portion of the metal-to-metal bond is curved.

9. The electronic device of claim 8, wherein in the vertical cross-section, the lower pillar end is curved with a profile that comprises a plurality of different radii of curvature.

10. The electronic device of claim 1, where the lower pillar end is free of solder.

11. An electronic device comprising:
    an upper substrate;
    a metal pillar that comprises a metal, the metal pillar comprising an upper pillar end coupled to the upper substrate, a lower pillar end, and a pillar sidewall between the upper pillar end and the lower pillar end, where the lower pillar end is free of solder;
    a lower substrate that is lower in a vertical direction than the upper substrate;
    a metal contact structure comprising the metal, the metal contact structure comprising a lower side coupled to the lower substrate, and an upper side that comprises a cavity; and
    a metal-to-metal bond between the lower pillar end and the upper side of the metal contact structure, wherein:
        the metal-to-metal bond is positioned within the cavity; and
        in a vertical cross-section, at least a portion of the lower pillar end is curved.

12. The electronic device of claim 11, wherein in the vertical cross-section, the lower pillar end comprises a plurality of different radii of curvature.

13. The electronic device of claim 11, wherein in a horizontal cross-section perpendicular to the vertical direction, the metal pillar is polygonal.

14. The electronic device of claim 11, comprising a vertical gap between a portion of the lower pillar end and the upper side of the metal contact structure.

15. The electronic device of claim 11, wherein in the vertical cross-section, at least a portion of the upper side of the metal contact structure is curved.

16. The electronic device of claim 11, wherein in the vertical cross-section, the upper side of the metal contact structure comprises a plurality of different radii of curvature.

17. A method of manufacturing an electronic device, the method comprising:
    providing a first assembly comprising:
        an upper substrate; and
        a metal pillar that comprises a metal, the metal pillar comprising an upper pillar end coupled to the upper substrate, a lower pillar end, and a pillar sidewall between the upper pillar end and the lower pillar end;
    providing a second assembly comprising:
        a lower substrate that is lower in a vertical direction than the upper substrate; and
        a metal contact structure comprising the metal, the metal contact structure comprising a lower side coupled to the lower substrate, and an upper side that comprises a cavity; and
    forming a metal-to-metal bond between the lower pillar end and the upper side of the metal contact structure, wherein the metal-to-metal bond is positioned within a first range of vertical heights within the cavity, but not within a second range of vertical heights within the cavity, where the first range of vertical heights is lower in the vertical direction than the second range of vertical heights.

18. The method of claim 17, wherein the second range of vertical heights within the cavity comprises a lateral gap between said metal of the metal pillar and said metal of the metal contact structure that encircles said metal of the metal pillar.

19. The method of claim 17, wherein in the first range, the pillar sidewall is vertical and lateral sides of the cavity are not vertical.

20. The method of claim 17, wherein in a vertical cross-section, at least a portion of the metal-to-metal bond is curved.

* * * * *